United States Patent
Gude (10) Patent No.: US 11,095,288 B2
(45) Date of Patent: Aug. 17, 2021

(54) SWITCHBOX

(71) Applicant: Michael Gude, Kerpen (DE)

(72) Inventor: Michael Gude, Kerpen (DE)

(*) Notice: Subject to any disclaimer, the term of this patent is extended or adjusted under 35 U.S.C. 154(b) by 0 days.

(21) Appl. No.: 16/873,972

(22) Filed: Sep. 2, 2020

(65) Prior Publication Data

US 2021/0075422 A1    Mar. 11, 2021

(30) Foreign Application Priority Data

Sep. 5, 2019  (DE) .................... DE102019006293.0

(51) Int. Cl.
*H03K 19/177* (2020.01)

(52) U.S. Cl.
CPC .................. *H03K 19/177* (2013.01)

(58) Field of Classification Search
CPC ........... H03K 19/177; H03K 19/17736; H03K 19/1737
USPC ....................................... 326/38–41
See application file for complete search history.

(56) References Cited

U.S. PATENT DOCUMENTS

| | | | | |
|---|---|---|---|---|
| 5,212,652 A * | 5/1993 | Agrawal | ............ | H03K 19/1737 326/41 |
| 5,764,080 A * | 6/1998 | Huang | ............. | H03K 19/17736 326/39 |
| 5,936,424 A * | 8/1999 | Young | ................ | H03K 19/1737 326/39 |
| 6,097,212 A * | 8/2000 | Agrawal | ............ | H03K 19/1737 326/38 |
| 6,294,928 B1 * | 9/2001 | Lytle | ..................... | H03K 19/177 326/34 |
| 6,353,841 B1 * | 3/2002 | Marshall | ................. | G06F 7/527 708/232 |
| 6,631,510 B1 * | 10/2003 | Betz | ........................ | G06F 30/34 716/121 |
| 7,375,546 B1 * | 5/2008 | Rahman | ............... | H03K 17/005 326/26 |
| 7,852,108 B1 * | 12/2010 | Lesea | ............... | H03K 19/17764 326/15 |
| 8,058,905 B1 * | 11/2011 | Klein | .................... | G06F 1/3203 326/93 |
| 2007/0164785 A1 * | 7/2007 | He | .......................... | G06F 30/34 326/41 |
| 2008/0074142 A1 * | 3/2008 | Henderson | ....... | H03K 19/17732 326/41 |

* cited by examiner

*Primary Examiner* — Don P Le

(57) ABSTRACT

Switchboxes are especially used in integrated circuits with programmable logic (e.g. FPGAs). They are used to establish configurable signal paths between logic blocks. The present invention is based on the task to present a switchbox with a small number of multiplexers and configuration bits, which can both forward a signal in signal direction and can implement a change of direction.

The task is solved by using switchboxes consisting of direction multiplexers and at least one direction change multiplexer. Thus the signal direction can be changed arbitrarily without increasing the size of the direction change multiplexers.

7 Claims, 8 Drawing Sheets

PRIOR ART

Fig. 1:

PRIOR ART

Fig. 8

SWITCHBOX

TECHNICAL FIELD

The present application relates generally to the field of integrated semiconductor especially to programmable logic.

BACKGROUND OF THE INVENTION

Switchboxes are especially used in integrated circuits with programmable logic (e.g. FPGAs). They are used to establish configurable signal paths between logic blocks.

Figure 1:
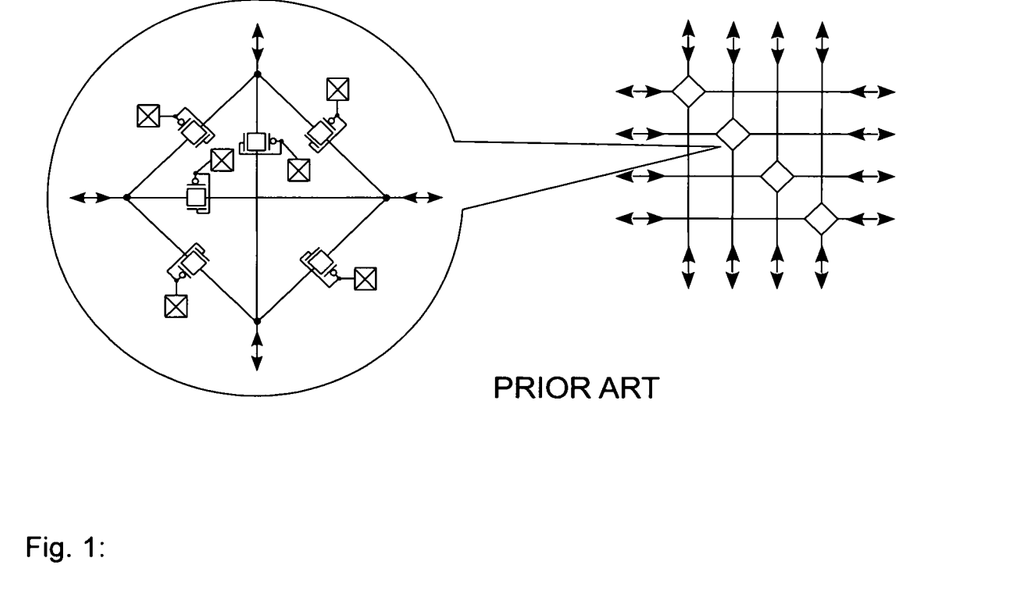
FIG. 1: Switchbox with six transmission gates
Usual arrangement according to prior art

According to the state of the art (FIG. 1) switchboxes with 6 transmission gates are available. These require 6 configuration bits. This arrangement can route one or two signals in each direction. The disadvantage is that there is no signal amplification and the connection of several line segments quickly leads to a significant signal delay and degeneration of the signal edges.

Figure 2:
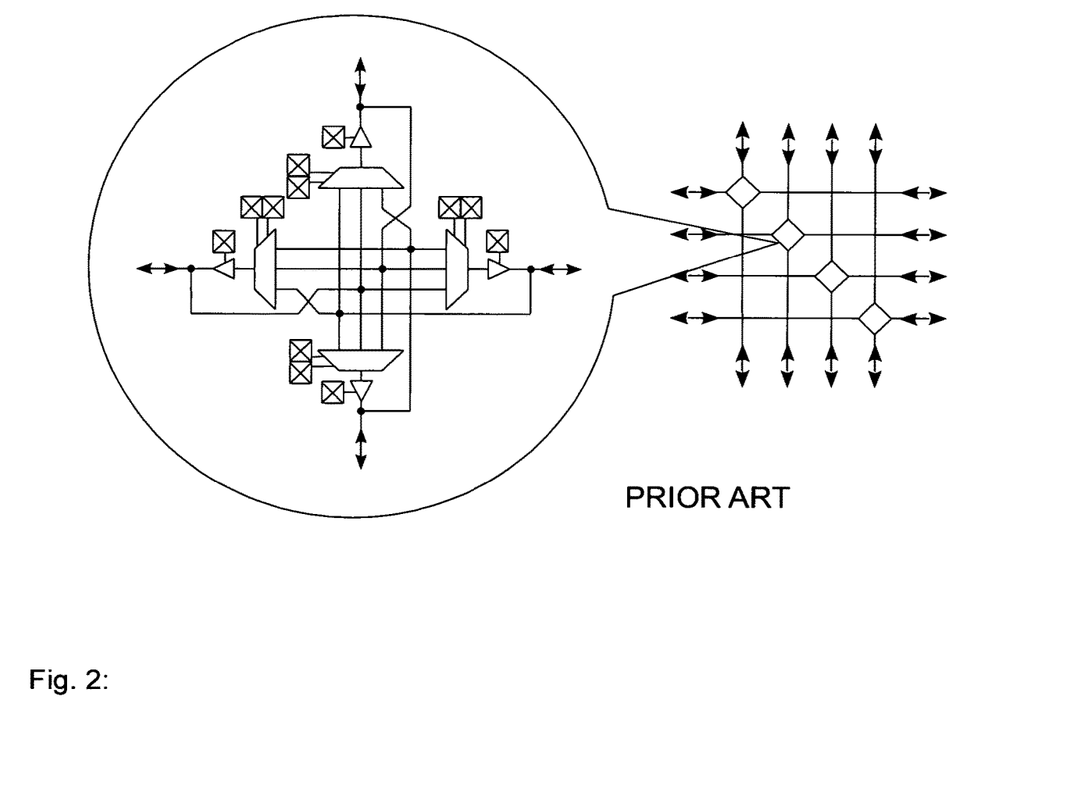
FIG. 2: Switchbox with four multiplexers
Usual arrangement according to prior art

This problem can be avoided by using multiplexers with signal amplification (FIG. 2). This arrangement can also route any signal in any direction. In this case, tristate buffers allow to use the signal paths in different directions. However, this requires four 4-to-1 multiplexers, 4 tristate buffers, and 12 configuration bits, which considerably increases the chip area. Here, too, a considerable delay is generated after a sequence of several connections, but the edge steepness of the signals is maintained at the output of the multiplexers due to the repeated amplification.

Figure 3:
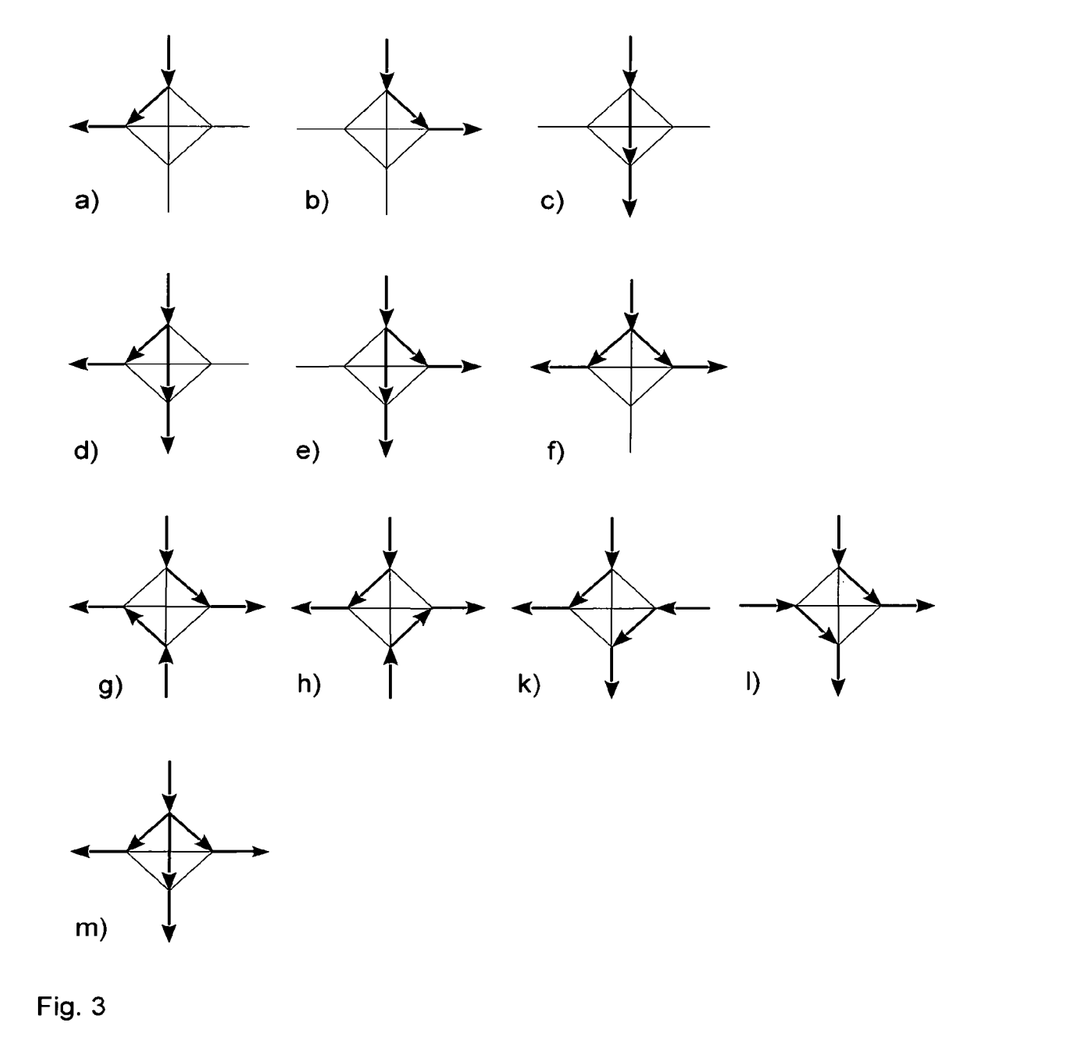
FIG. 3: Connection paths (south *) of the switchbox from FIG. 1 and FIG. 2.
*The connecting paths in the three other directions are symmetrically designed.

The possible signal paths are shown in FIG. 3 (southwards). For all signal paths the arrangement must be rotated by 90 degrees.

The present invention is based on the task of presenting a switchbox with a small number of multiplexers and configuration bits, which can both forward a signal in the signal direction and implement a change of direction.

Care must be taken that the drawings only reveal the invention as an example. The invention is not limited to these examples of application.

DETAILED DESCRIPTION

The present invention is based on the task of presenting a switchbox with a small number of multiplexers and configuration bits, which can both forward a signal in the signal direction and implement a change of direction.

According to the invention, this task is solved by the characteristic features of the patent claims.

Figure 4:
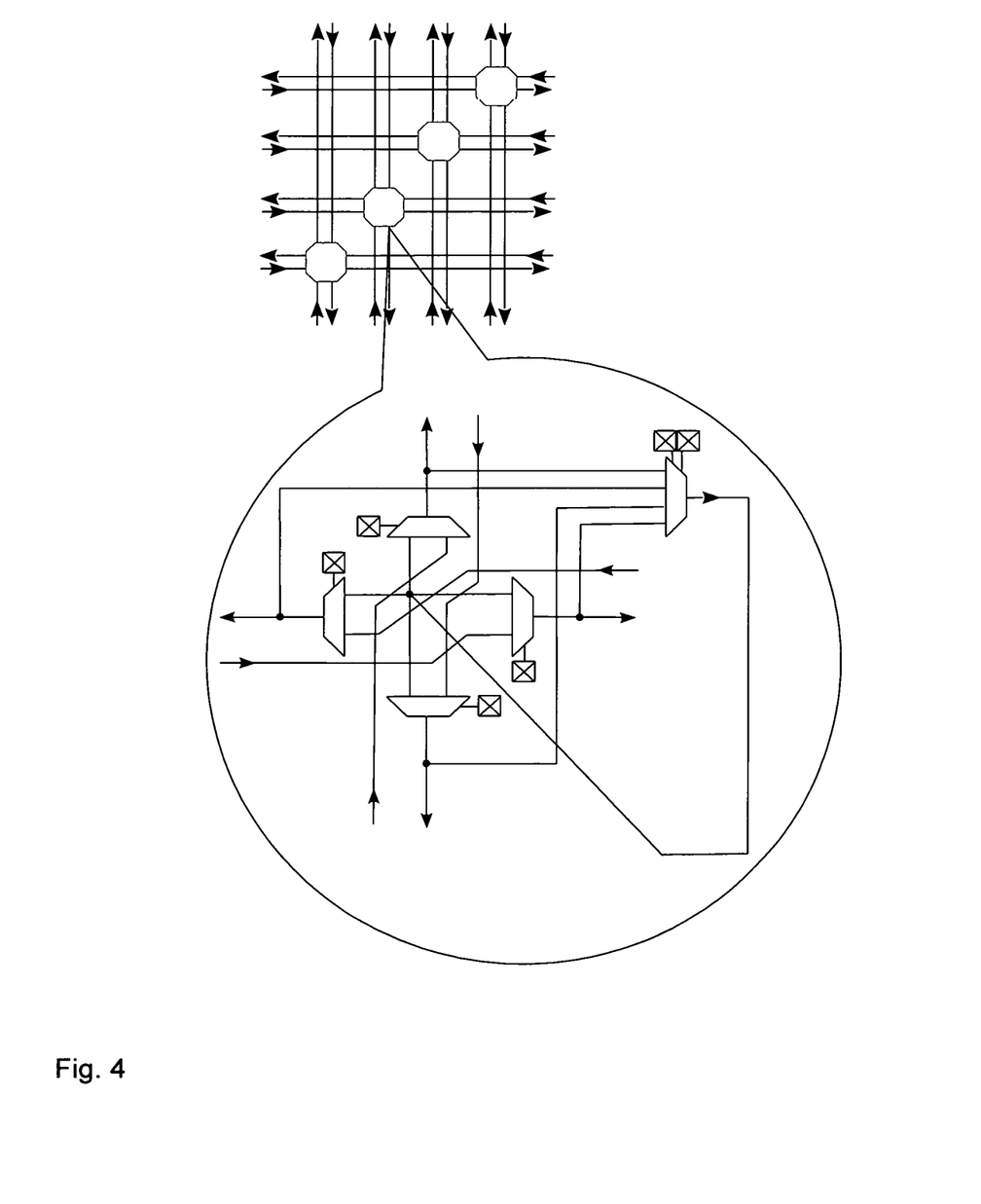
FIG. 4: Switchbox with one direction change multiplexer
Inventive arrangement with a direction change multiplexer

Here, the main claim 1 claims an arrangement according to FIG. 4.

The four 1-to-2 direction change multiplexers switch between a direct transmission of a signal in the signal direction and a change of direction. Which signal is used for this change of direction is determined by the 4-to-1 direction change multiplexer (FIG. 4). Only 6 setting bits are required. Furthermore, the routing is unidirection change, which makes tristate gates and their delay superfluous. Unused connections can also not float.

Figure 5:
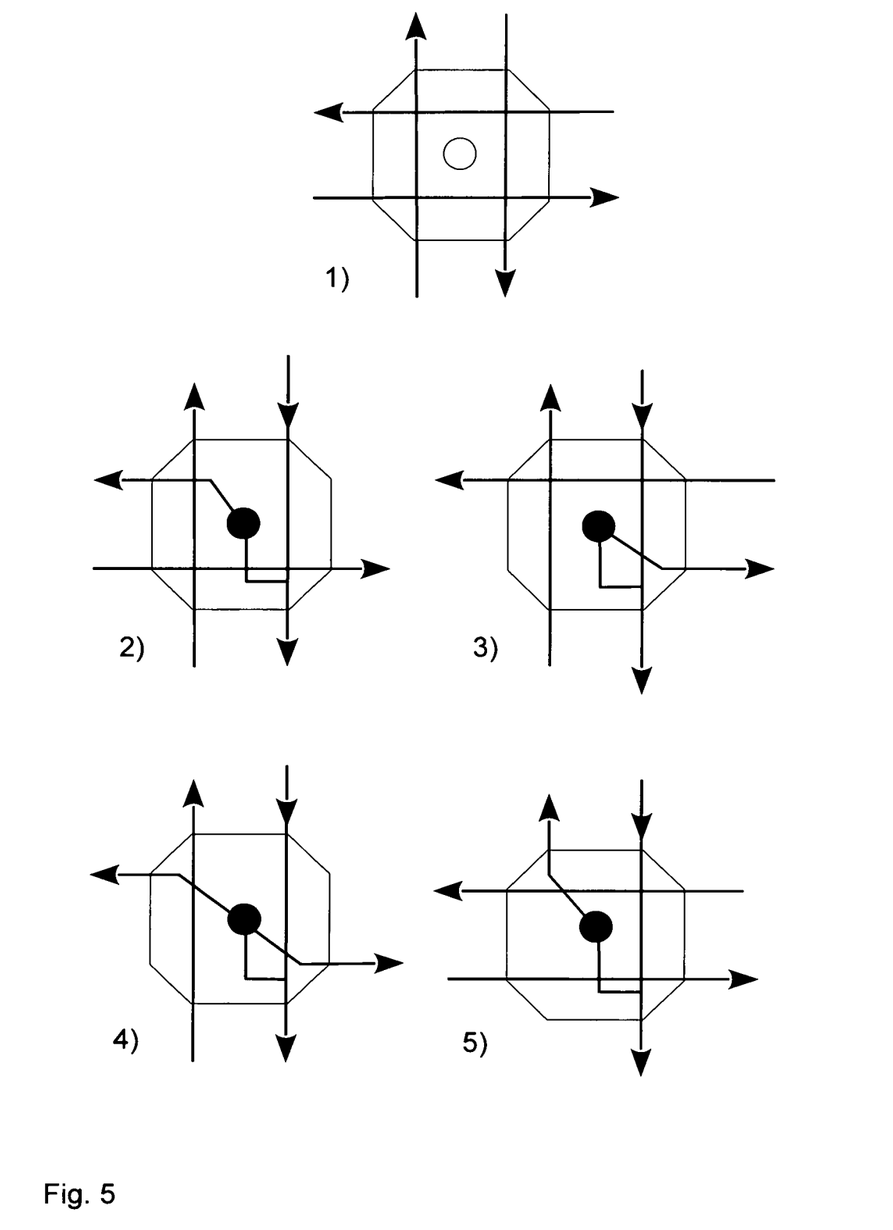
FIG. 5: Connection paths (south *) of the switchbox according to FIG. 4
*The connecting paths in the other three directions are symmetrically designed.

The possible signal paths are shown in FIG. 5 (south). For all signal paths the arrangement must be rotated by 90 degrees.

FIG. 4 also shows an arrangement according to claims 2 and 3: The direction change multiplexer does not drive signal lines to other switchboxes, but only signals to the direction change multiplexers, which leads to low delay due to the short line paths.

Figure 6:
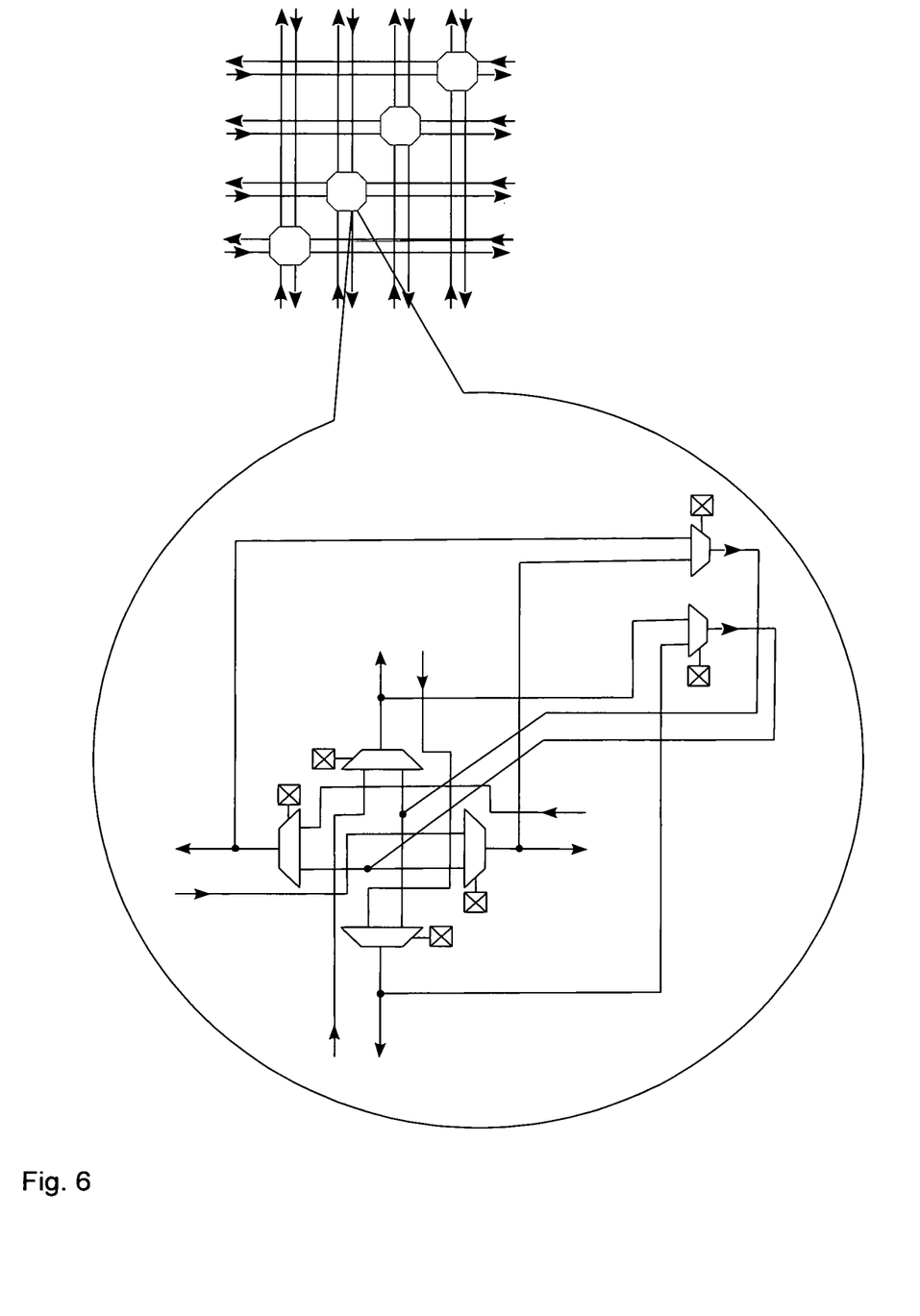
FIG. 6: Switchbox with two direction change multiplexers
Inventive arrangement with two direction change multiplexers

FIG. 6 shows an arrangement according to claim 4 with two direction change multiplexers. Here, certain direction change changes of two signals are possible at the same time. The number of setting bits has not increased compared to the arrangement according to FIG. 4.

Figure 7:
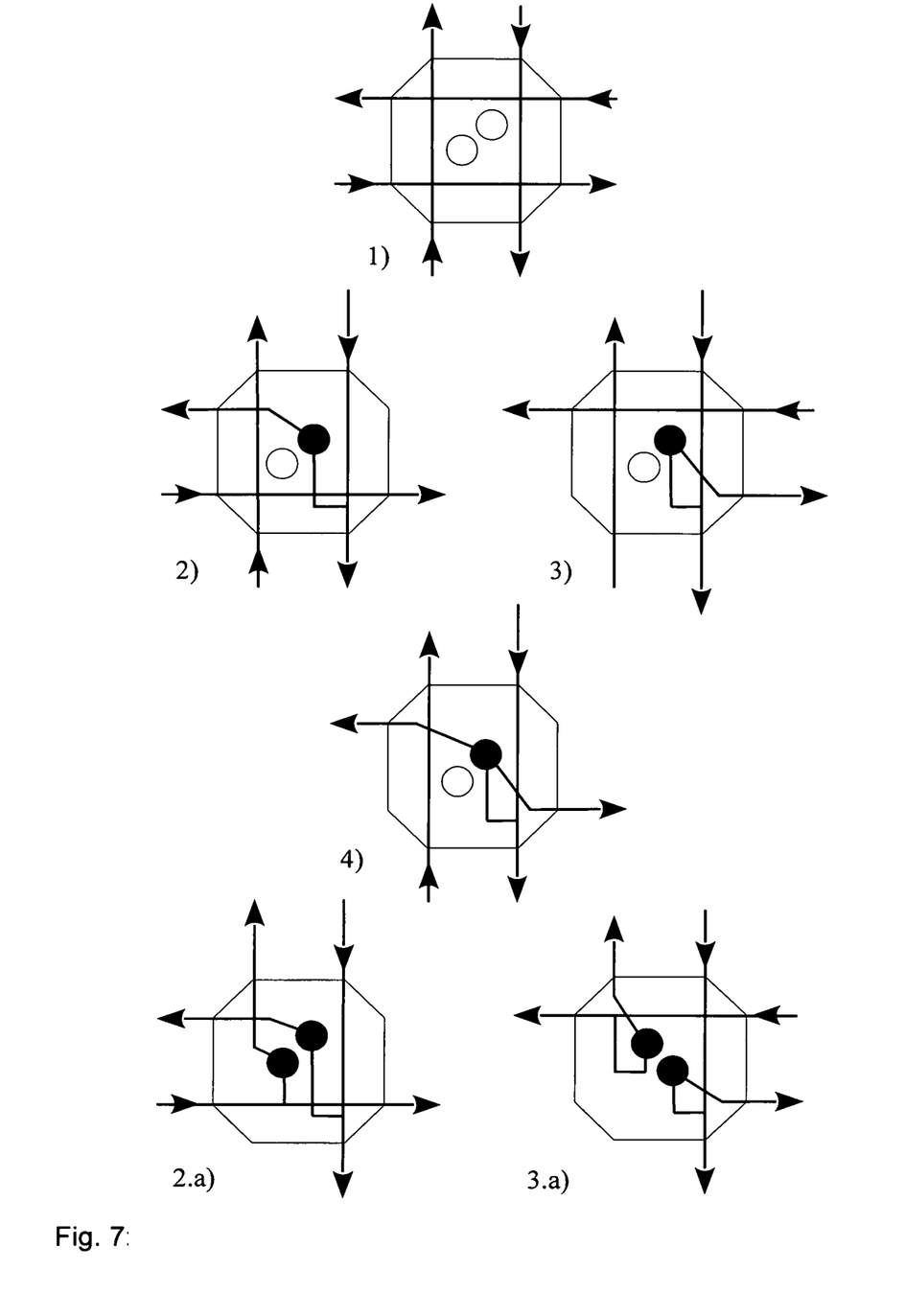
FIG. 7: Connection paths (south *) of the switchbox from FIG. 6
*The connecting paths in the other three directions are symmetrically designed.

The possible signal paths are shown in FIG. 7 (south). For all signal paths, the arrangement must be turned by 90 degrees.

Figure 8:
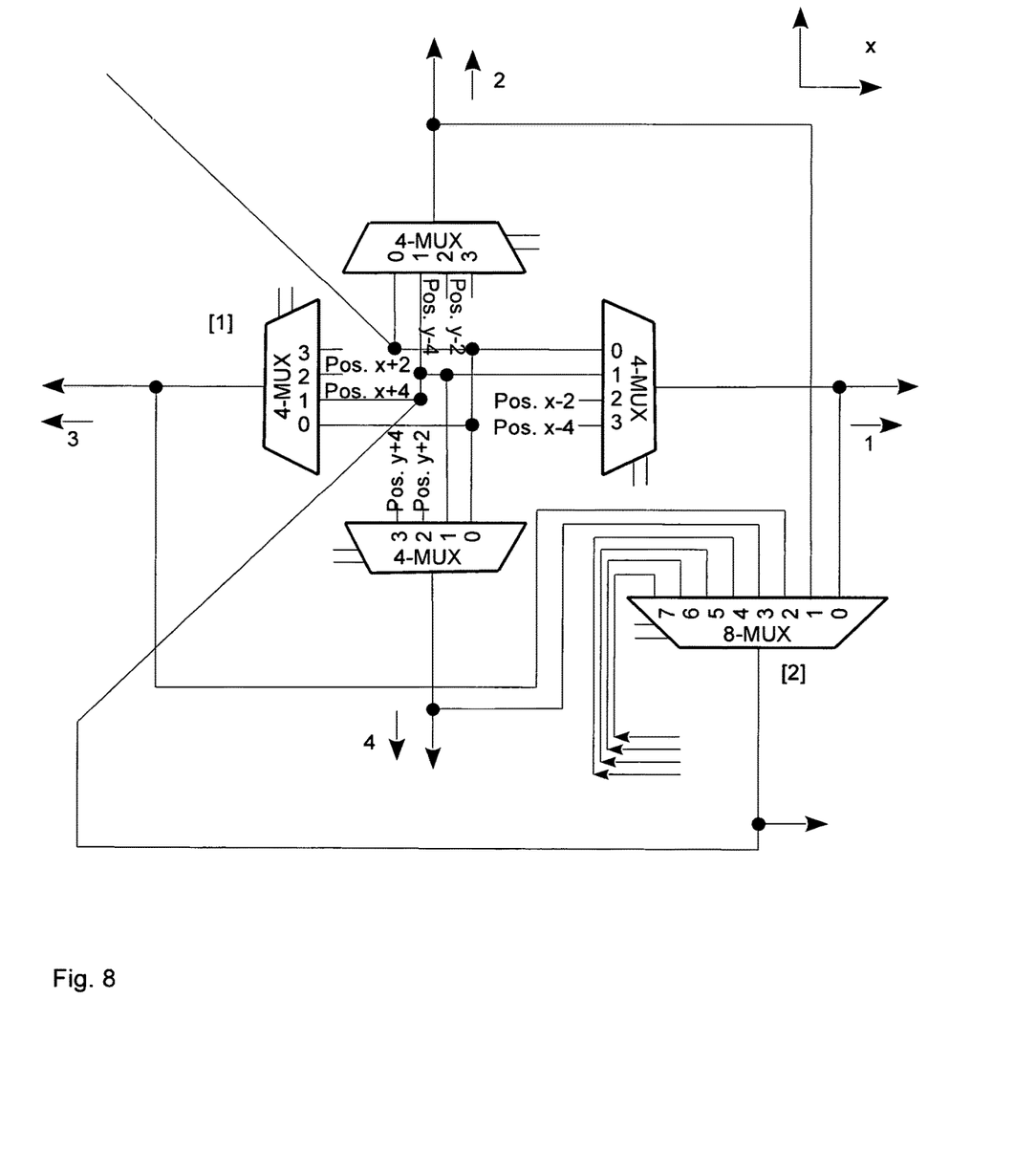
FIG. 8: Switchbox with diagonal connections
and different distances to other switchboxes
There are connections to diagonal switchboxes via the direction change multiplexer.

An arrangement according to claim 5 is shown in FIG. 8. Here, the direction change multiplexer also accepts signals from diagonally removed switchboxes. Furthermore, the output of the direction change multiplexer is routed to diagonally located switchboxes.

The feature mentioned in claim 6 is also shown in FIG. 8. Here the direction change multiplexers are connected to other switchboxes in x and y distances 2 and 4. Here, the respective signal direction in x or y direction is maintained.

According to claim 7 it is also useful to provide connections to other direction change multiplexers, preferably in diagonal direction.

The invention claimed is:
1. Switchbox consisting of direction multiplexers and at least one direction change multiplexer characterized in that the direction multiplexers only forward a signal in one direction and the direction change multiplexer(s) can divert a signal in another direction.
2. Switchbox according to claim 1, characterized in that the inputs of the direction change multiplexer(s) are connected to outputs of the direction multiplexer.
3. Switchbox according to claim 1, characterized in that inputs of the direction multiplexer are driven by the direction change multiplexer(s).
4. Switchbox according to claim 1, characterized in that two direction change multiplexers are used.
5. Switchbox according to claim 1, characterized in that there is at least one connection to another switchbox located diagonally.

6. Switchbox according to claim 1, characterized in that the direction multiplexers are connected to switch boxes at different distances.

7. Switchbox according to claim 1, characterized in that the direction change multiplexer(s) are connected to switch boxes at different distances.

* * * * *